(12) United States Patent
Wang et al.

(10) Patent No.: US 10,262,987 B2
(45) Date of Patent: Apr. 16, 2019

(54) ELECTROSTATIC DISCHARGE PROTECTION CIRCUIT

(71) Applicant: UNITED MICROELECTRONICS CORP., Hsin-Chu (TW)

(72) Inventors: Li-Cih Wang, Taoyuan (TW); Lu-An Chen, Hsinchu County (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 114 days.

(21) Appl. No.: 15/481,444

(22) Filed: Apr. 6, 2017

(65) Prior Publication Data

US 2017/0213818 A1 Jul. 27, 2017

Related U.S. Application Data

(62) Division of application No. 14/594,173, filed on Jan. 12, 2015, now abandoned.

(51) Int. Cl.
*H01L 27/02* (2006.01)
*H02H 9/04* (2006.01)

(52) U.S. Cl.
CPC ...... *H01L 27/0259* (2013.01); *H01L 27/0255* (2013.01); *H01L 27/0288* (2013.01); *H02H 9/046* (2013.01)

(58) Field of Classification Search
CPC . H01L 27/02; H01L 27/0255; H01L 27/0288; H01L 27/0259; H02H 9/046
See application file for complete search history.

(56) References Cited

U.S. PATENT DOCUMENTS

| 7,932,582 B2 | 4/2011 | Vashchenko | |
| 2008/0316659 A1* | 12/2008 | Oguzman | H01L 27/0259 361/56 |
| 2010/0208398 A1 | 8/2010 | Jou | |
| 2012/0267764 A1* | 10/2012 | Jung | H01L 29/66272 257/566 |
| 2014/0125130 A1* | 5/2014 | Cao | H02M 5/257 307/23 |
| 2016/0035834 A1* | 2/2016 | Mohai | H01L 27/0716 257/139 |
| 2016/0156180 A1* | 6/2016 | Besse | H02H 9/046 361/56 |

\* cited by examiner

*Primary Examiner* — Zeev V Kitov
(74) *Attorney, Agent, or Firm* — Winston Hsu

(57) ABSTRACT

The present invention provides an ESD protection circuit electrically connected between a high voltage power line and a low voltage power line, and the ESD protection circuit includes a bipolar junction transistor (BJT) and a trigger source. A collector of the BJT is electrically connected to the high voltage power line, and an emitter and a base of the BJT are electrically connected to the low voltage power line. The trigger source is electrically connected between the base of the BJT and the high voltage power line.

4 Claims, 7 Drawing Sheets

ELECTROSTATIC DISCHARGE PROTECTION CIRCUIT

CROSS REFERENCE TO RELATED APPLICATIONS

This application is a divisional application of and claims the benefit of U.S. patent application Ser. No. 14/594,173, filed Jan. 12, 2015.

BACKGROUND OF THE INVENTION

1. Field of the Invention

The present invention relates to an electrostatic discharge (ESD) protection circuit and an ESD protection device, and more particularly, to an ESD protection circuit and an ESD protection device using a trigger source to trigger a bipolar junction transistor to protect a circuit during an ESD event.

2. Description of the Prior Art

Electrostatic Discharge (ESD) is a rapid discharge that flows between two objects due to the built-up of static charge. ESD may destroy semiconductor devices because the rapid discharge can produce a relatively large current. In order to reduce the semiconductor failures due to ESD, ESD protection circuits have been developed to provide a current discharge path. When an ESD event occurs, the discharge current is conducted through the discharge path without going through the internal circuits to be protected.

In the traditional ESD protection circuit, the holding voltage is much smaller than the operating voltage of the internal circuit. Since that, when the traditional ESD protection circuit is triggered on, it is easily latched up and cannot protect the internal circuit. In order to solve the latch-up issue, a stacked ESD device has been developed. Despite having a relatively high holding voltage, the stacked ESD device is formed by a plurality of gate-grounded n-type metal-oxide-semiconductor (NMOS) transistors connected in series, thereby requiring a large layout area.

SUMMARY OF THE INVENTION

It is an objective of the present invention is to provide an electrostatic discharge protection circuit and an electrostatic discharge protection device to increase the holding voltage and save the layout area.

According to an embodiment of the present invention, an ESD protection circuit electrically connected between a high voltage power line and a low voltage power line is disclosed. The ESD protection circuit includes a bipolar junction transistor (BJT) and a trigger source. A collector of the BJT is electrically connected to the high voltage power line, and an emitter and a base of the BJT are electrically connected to the low voltage power line. The trigger source is electrically connected between the base of the BJT and the high voltage power line.

According to another embodiment of the present invention, an ESD protection circuit connected between a high voltage power line and a low voltage power line is disclosed. The ESD protection circuit includes a first BJT and a second BJT. The first BJT includes a first parasitic diode. The second BJT includes a second parasitic diode, wherein a collector of the first BJT and a collector of the second BJT are electrically connected to the high voltage power line, and an emitter and a base of the first BJT and an emitter and a base of the second BJT are electrically connected to the low voltage power line.

According to another embodiment of the present invention, an ESD protection device is disclosed. The ESD protection device includes a substrate, a buried layer, a first well, a second well, a first doped region, and a second doped region. The buried layer is buried in the substrate, and the buried layer has a first conductive type. The first well is disposed in the substrate, and the first well is in contact with the buried layer and has the first conductive type. The second well is disposed in the substrate, and the second well is in contact with the buried layer and the first well and has a second conductive type. The first doped region is disposed in the second well, and the first doped region has the first conductive type. The second doped region is disposed in the second well, and the second doped region has the second conductive type, wherein the second doped region is disposed between the first doped region and the first well.

In the ESD protection circuit and the ESD protection device of the present invention, the holding voltage is increased only by adjusting the base width of the BJT. Thus, the ESD protection device doesn't require extra layout area to dispose extra transistors. Therefore, the ESD protection device not only solves the latch-up issue but also saves the layout area.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
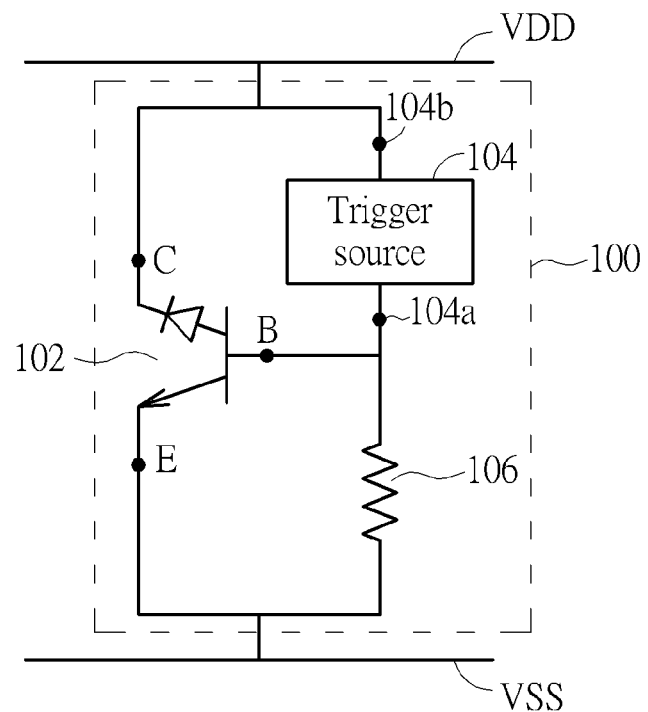
FIG. 1 is a schematic diagram illustrating an ESD protection circuit according to a first embodiment of the present invention.

Refer to FIG. 1, which is a schematic diagram illustrating an ESD protection circuit according to a first embodiment of the present invention. As shown in FIG. 1, the ESD protection circuit 100 is electrically connected between a terminal for generating the electrostatic charges and another terminal for releasing the ESD current. In this embodiment, the ESD protection circuit 100 may be electrically connected between a high voltage power line VDD and a low voltage power line VSS and used as a power-rail ESD clamp circuit, so that the ESD protection circuit 100 may be used to protect an internal circuit electrically connected between the high voltage power line VDD and the low voltage power line VSS from being damaged by an ESD event occurring in the high voltage power line VDD. The present invention is not limited to this.

In this embodiment, the ESD protection circuit 100 includes a bipolar junction transistor (BJT) 102 and a trigger source 104. The BJT 102 may include an NPN BJT. A base B, an emitter E and a collector C of the BJT are electrically connected to a first end 104a of the trigger source 104, the low voltage power line VSS and the high voltage power line VDD respectively. A second end 104b of the trigger source 104 is electrically connected to the high voltage power line VDD. Since the trigger source 104 is electrically connected between the high voltage power line VDD and the base B of the BJT 102, when the ESD event occurs in the high voltage power line VDD, the trigger source 104 can generate a trigger current to the base B of the BJT 102. Accordingly, the BJT 102 can be triggered on and conduct the ESD current from the high voltage power line VDD to the low voltage power line VSS, thereby protecting the internal circuit from damage. Furthermore, since the BJT 102 is used to discharge the ESD current, a holding voltage of the ESD protection circuit 100 can be determined by a base width of the BJT 102. Accordingly, based on requirements, the base width of the BJT 102 can be designed to be close to the operating voltage of the internal circuit for avoiding the ESD protection circuit 100 having the latch-up issue. For example, the holding voltage of the ESD protection circuit 100 may be raised to be greater than 40 voltages. It should be noted that the ESD protection circuit 100 only uses the BJT 102 to discharge the ESD current instead of using the stacked ESD device, so that the area of the ESD protection circuit 100 can be effectively reduced.

In this embodiment, the ESD protection circuit 100 may further comprising a resistor 106 electrically connected between the base B of the BJT 102 and the low voltage power line VSS.

Figure 2:
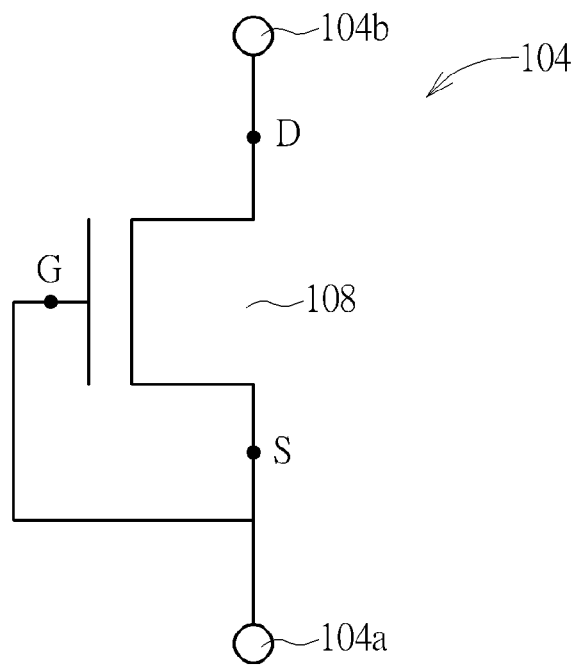
FIG. 2 is a schematic diagram illustrating the trigger source according to the first embodiment of the present invention.

Refer to FIG. 2, which is a schematic diagram illustrating the trigger source according to the first embodiment of the present invention. As shown in FIG. 2, the trigger source 104 may include a gate-grounded N-type metal-oxide-semiconductor (NMOS) transistor. A drain D of the NMOS transistor 108 serves as the second end 104b of the trigger source 104, so that the drain D is electrically connected to the high voltage power line VDD. A gate G and a source S of the MOS transistor 108 are electrically connected to each other and serve as the first end 104a of the trigger source 104, so that the gate G and the source S are electrically connected to the base B of the BJT 102.

The trigger source of the present invention is not limited to the above-mentioned embodiment. The following description continues to detail the other embodiments or modifications, and in order to simplify and show the difference between the other embodiments or modifications and the above-mentioned embodiment, the same numerals denote the same components in the following description, and the same parts are not detailed redundantly.

Figure 3:
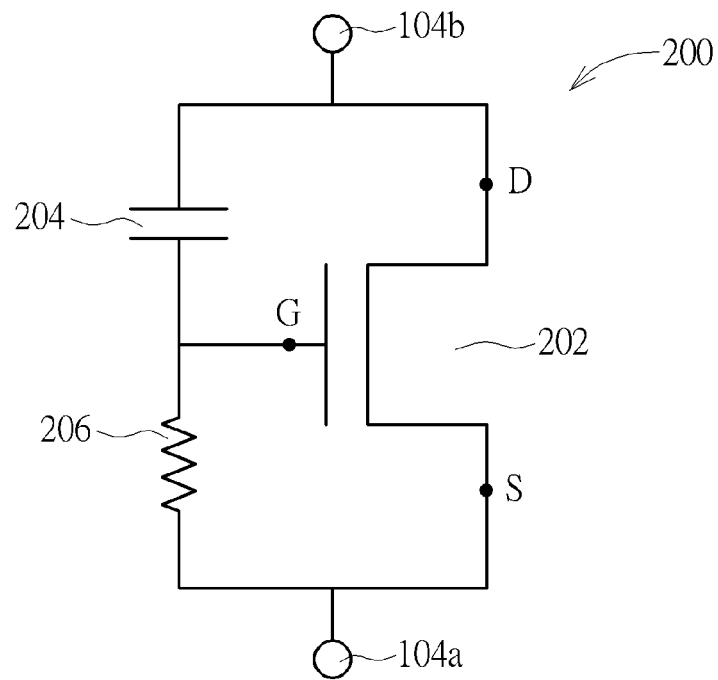
FIG. 3 is a schematic diagram illustrating a trigger source according to a second embodiment of the present invention.

Refer to FIG. 3 together with FIG. 1. FIG. 3 is a schematic diagram illustrating a trigger source according to a second embodiment of the present invention. As shown in FIG. 1 and FIG. 3, the second embodiment is different from the first embodiment in that the trigger source 200 includes an NMOS transistor 202, a capacitor 204 and a resistor 206. In this embodiment, a drain D of the NMOS transistor 202 serves as the second end 104b of the trigger source 200 so as to be electrically connected to the high voltage power line VDD. A source S of the NMOS transistor 202 serves as the first end 104a of the trigger source 104 so as to be electrically connected to the base B of the BJT 102. The capacitor 204 is electrically connected between the drain D and a gate G of the NMOS transistor 202. The resistor 206 is electrically connected between the gate G and the source S. With a capacitor-resistor (CR) circuit provided by the capacitor 204 and the resistor 206 at the gate G of the NMOS transistor 202, when the ESD event occurs, the gate G of the NMOS transistor 202 is pulled to logic high, and the NMOS transistor 202 is turned on. Accordingly, the ESD current can be conducted through the NMOS transistor 202 and regarded as the trigger current to trigger on the BJT 102. Thus, the BJT 102 can form a discharging path to discharge the ESD current.

Figure 4:
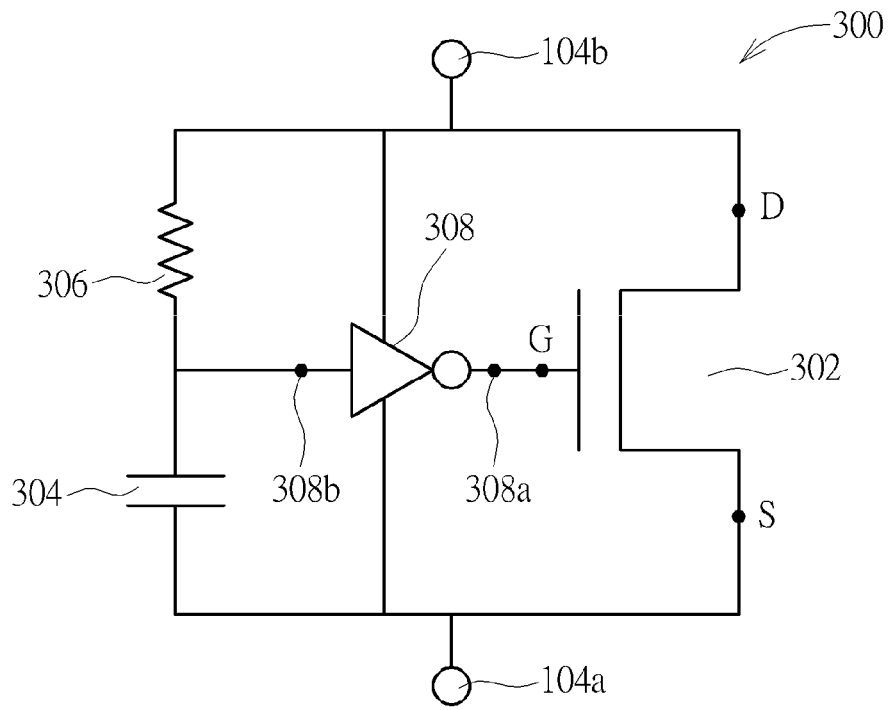
FIG. 4 is a schematic diagram illustrating a trigger source according to a third embodiment of the present invention.

Refer to FIG. 4 together with FIG. 1. FIG. 4 is a schematic diagram illustrating a trigger source according to a third embodiment of the present invention. As shown in FIG. 1 and FIG. 4, the third embodiment is different from the first embodiment in that the trigger source 300 includes an NMOS transistor 302, a capacitor 304, a resistor 306 and an inverter 308. In this embodiment, a drain D of the NMOS transistor 302 serves as the second end 104b of the trigger source 300 so as to be electrically connected to the high voltage power line VDD. A source S of the NMOS transistor 302 serves as the first end 104a of the trigger source 300 so as to be electrically connected to the base B of the BJT 102. Furthermore, a gate G of the NMOS transistor 302 is electrically connected to an output node 308a of the inverter 308. The resistor 306 is electrically connected between an input node 308b of the inverter 308 and the drain D of the NMOS transistor 302. The capacitor 304 is electrically connected between the input node 308b of the inverter 308 and the source S of the NMOS transistor 302. As compared with the second embodiment, the trigger source 300 of this embodiment further uses the inverter 308 and switches the capacitor 304 and the resistor 306. When the ESD event occurs, the input node 308b of the inverter 308 is initially logic low, which causes the output node 308a of the inverter 308 to be logic high and turns on the NMOS transistor 302. Accordingly, the ESD current can be conducted through the NMOS transistor 302 and regarded as the trigger current to trigger on the BJT 102.

Figure 5:
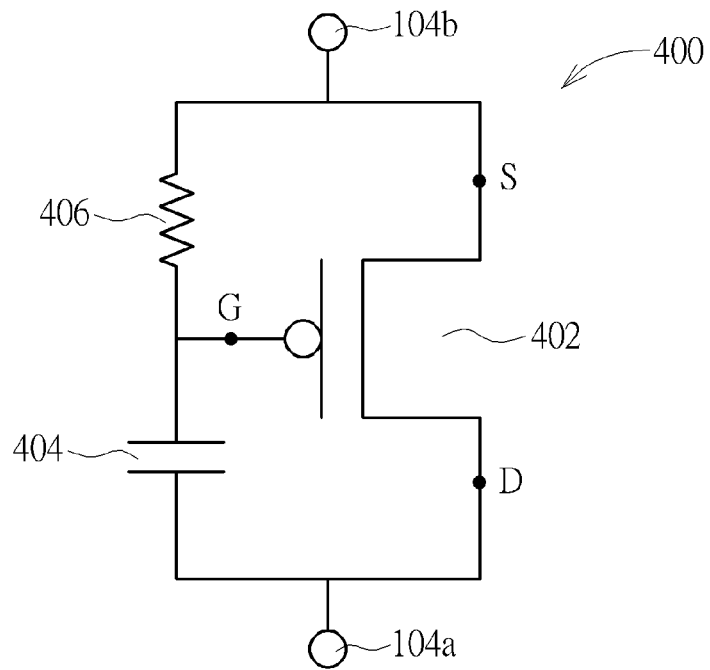
FIG. 5 is a schematic diagram illustrating a trigger source according to a fourth embodiment of the present invention.

Refer to FIG. 5 together with FIG. 1. FIG. 5 is a schematic diagram illustrating a trigger source according to a fourth embodiment of the present invention. As shown in FIG. 1 and FIG. 5, the fourth embodiment is different from the first embodiment in that the trigger source 400 includes a PMOS transistor 402, a capacitor 404 and a resistor 406. In this embodiment, a source S and a drain D of the PMOS transistor 402 serves as the second end 104b and the first end 104a of the trigger source 400 respectively so as to be electrically connected to the high voltage power line VDD and the base B of the BJT 102 respectively. The capacitor 404 is electrically connected between a gate G and the drain D of the PMOS transistor 402. The resistor 406 is electrically connected between the gate G and the source S of the PMOS transistor 402. As compared with the second embodiment, the trigger source 400 of this embodiment uses the PMOS transistor 402 to replace the NMOS transistor 202, and switches the capacitor 404 and the resistor 406. When the ESD event occurs, the gate G of the PMOS transistor 402 is pulled to logic low, and the PMOS transistor 402 can be turned on. Accordingly, the ESD current can be conducted through the PMOS transistor 402 and regarded as the trigger current to trigger on the BJT 102. Thus, the BJT 102 can form a discharging path to discharge the ESD current.

Figure 6:
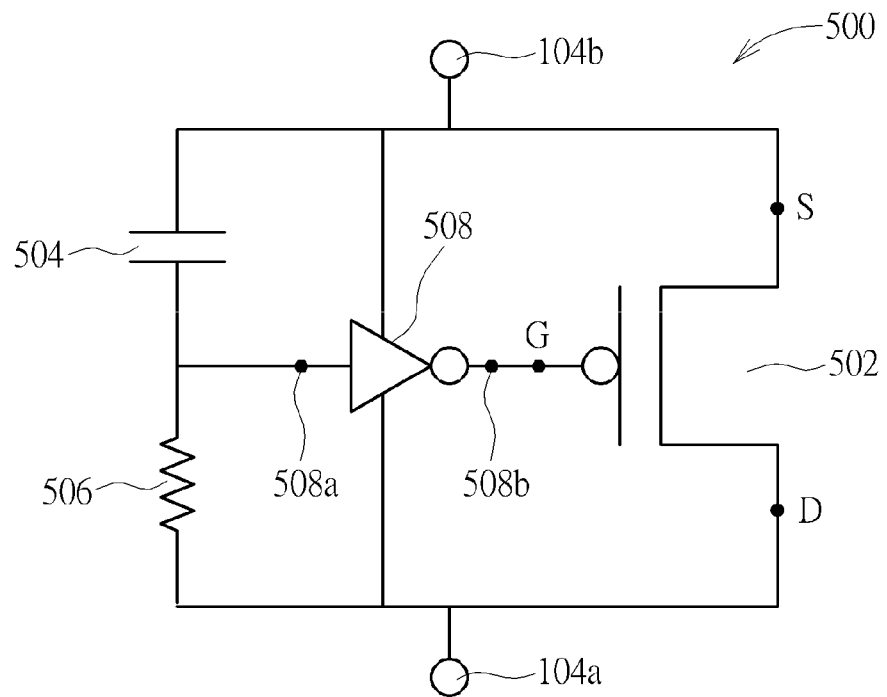
FIG. 6 is a schematic diagram illustrating a trigger source according to a fifth embodiment of the present invention.

Refer to FIG. 6 with FIG. 1. FIG. 6 is a schematic diagram illustrating a trigger source according to a fifth embodiment of the present invention. As shown in FIG. 1 and FIG. 6, the fifth embodiment is different from the first embodiment in that the trigger source 500 includes a PMOS transistor 502, a capacitor 504, a resistor 506 and an inverter 508. In this embodiment, a source S and a drain D of the PMOS transistor 502 serves as the second end 104b and the first end 104a of the trigger source 500 respectively so as to be electrically connected to the high voltage power line VDD and the base B of the BJT 102 respectively. A gate G of the PMOS transistor 502 is electrically connected to an output node 508b of the inverter 508. The capacitor 504 is electrically connected between the source S of the PMOS transistor 502 and an input node 508a of the inverter 508. The resistor 506 is electrically connected between the input node 508a of the inverter 508 and the drain D of the PMOS transistor 502.

Figure 7:
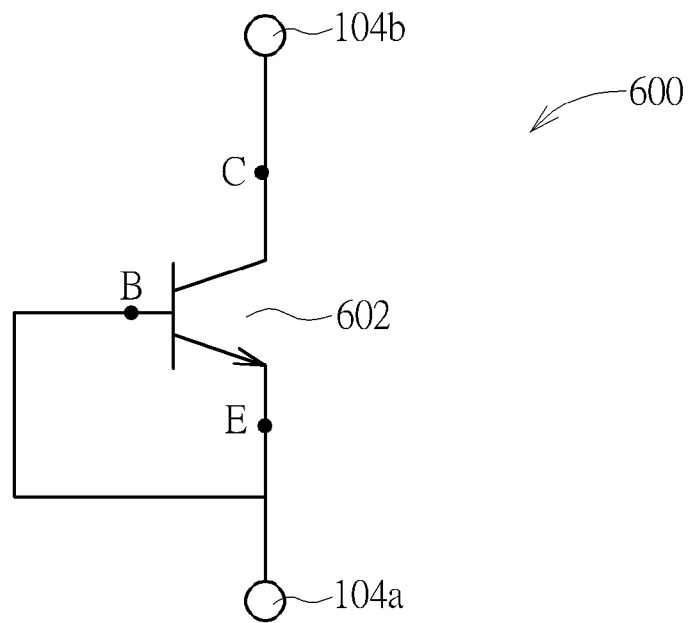
FIG. 7 is a schematic diagram illustrating a trigger source according to a sixth embodiment of the present invention.

Refer to FIG. 7 with FIG. 1. FIG. 7 is a schematic diagram illustrating a trigger source according to a sixth embodiment of the present invention. As shown in FIG. 1 and FIG. 7, the sixth embodiment is different from the first embodiment in that the trigger source 600 includes an NPN BJT 602. In this embodiment, an emitter E of the NPN BJT 602 serves as the first end 104a so as to be electrically connected to the base B of the BJT 102. And, a base B of the NPN BJT 602 is electrically connected to the emitter E. A collector C of the NPN BJT 602 serves as the second end 104b so as to be electrically connected to the high voltage power line VDD.

Figure 8:
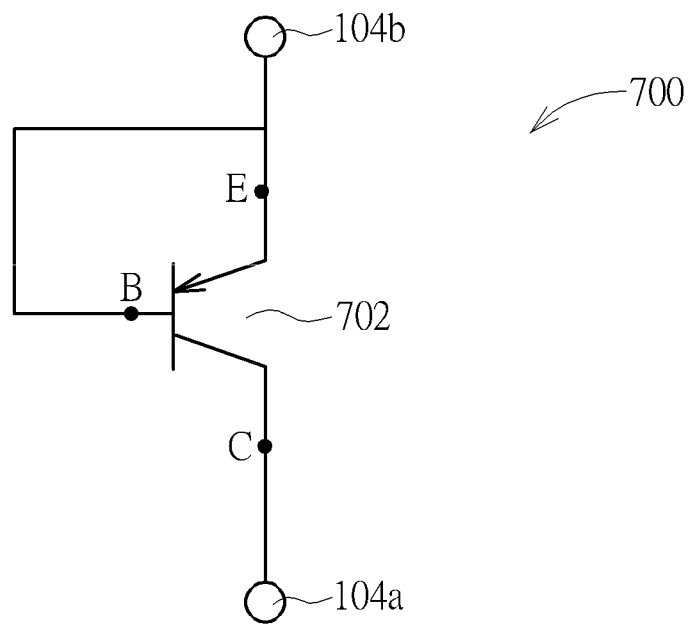
FIG. 8 is a schematic diagram illustrating a trigger source according to a seventh embodiment of the present invention.

Refer to FIG. 8 with FIG. 1. FIG. 8 is a schematic diagram illustrating a trigger source according to a seventh embodiment of the present invention. As shown in FIG. 8, the seventh embodiment is different from the first embodiment in that the trigger source 700 includes a PNP BJT 702. In this embodiment, an emitter E of the PNP BJT 702 serves as the second end 104b so as to be electrically connected to the high voltage power line VDD. And, a base B of the PNP BJT 702 is electrically connected to the emitter E. A collector C of the PNP BJT 702 serves as the second end 104a so as to be electrically connected to the base B of the BJT 102.

The ESD protection circuit of the present invention is not limited to the above-mentioned embodiment. The following description continues to detail the other embodiments or modifications, and in order to simplify and show the difference between the other embodiments or modifications and the above-mentioned embodiment, the same numerals denote the same components in the following description, and the same parts are not detailed redundantly.

Figure 9:
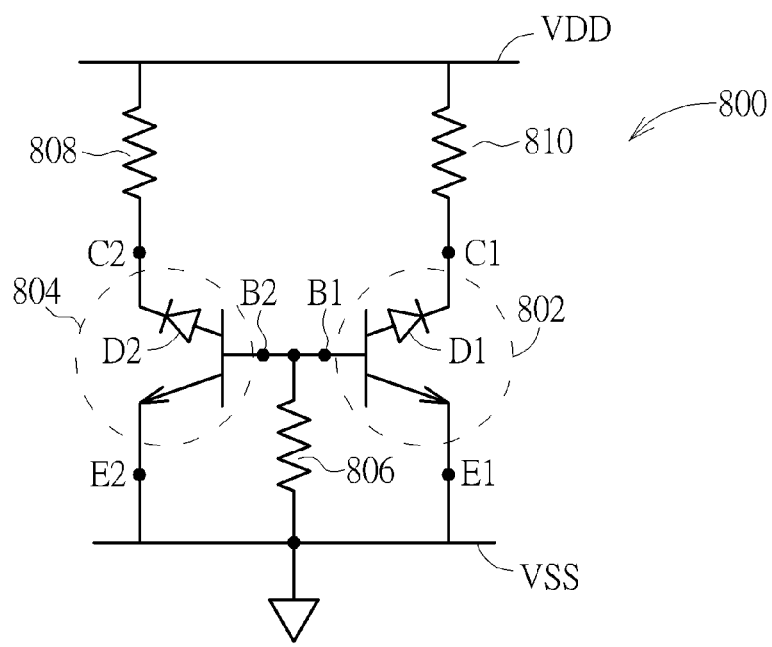
FIG. 9 is a schematic diagram illustrating an ESD protection circuit according to an eighth embodiment of the present invention.

Please refer to FIG. 9, which is a schematic diagram illustrating an ESD protection circuit according to an eighth embodiment of the present invention. As shown in FIG. 9, as compared with the first embodiment, the ESD protection circuit 800 of this embodiment includes a first BJT 802 and a second BJT 804. In this embodiment, the first BJT 802 and the second BJT 804 are NPN BJTs. The present invention is not limited to this, and the first BJT and the second BJT may be PNP BJTs. A collector C1 of the first BJT 802 and a collector C2 of the second BJT 804 are electrically connected to the high voltage power line VDD. An emitter E1 and a base B1 of the first BJT 802 and an emitter E2 and a base B2 of the second BJT 804 are electrically connected to the low voltage power line VSS. Specifically, the first BJT 802 includes a first parasitic diode D1 connected between the collector C1 and the base B1 of the first BJT 802. The second BJT 804 includes a second parasitic diode D2 connected between the collector C2 and the base B2 of the second BJT 804. A breakdown voltage of the first parasitic diode D1 is lower than a breakdown voltage of the second parasitic diode D2. Since that, the first BJT 802 can be regarded as the trigger source, and the second BJT 804 can be used to conduct the ESD current. When the ESD event occurs, the first parasitic diode D1 is more easily broken down than the second parasitic diode D2, so that the ESD current can cross the first parasitic diode D1 and enter the base B2 of the second BJT 804 to induce the second BJT 804 to turn on. Thus, the ESD current can be introduced through the second BJT 804 to the low voltage power line VSS. Also, the breakdown voltage of the first parasitic diode D1 can be used to determine the trigger voltage of the ESD protection circuit 800, and can be adjusted based on the design requirements.

For example, the first BJT 802 has a first base width. The second BJT 804 has a second base width. Since the first base width is shorter than the second base width, the breakdown voltage of the first parasitic diode D1 is lower than the breakdown voltage of the second parasitic diode D2. Accordingly, the second BJT 804 can be used to conduct the ESD current, the holding voltage of the ESD protection circuit can be determined by the second BJT 804. The present invention is not limited thereto.

In this embodiment, the ESD protection circuit 800 may optionally further includes a first resistor 806, a second resistor 808, and a third resistor 810. The first resistor 806 is electrically connected between the base B of the first BJT 802 and the low voltage power line VSS. The second resistor 808 is electrically connected between the collector C2 of the second BJT 804 and the high voltage power line VDD. The third resistor 810 is electrically connected between the collector C1 of the first BJT 802 and the high voltage power line VDD.

Figure 10:
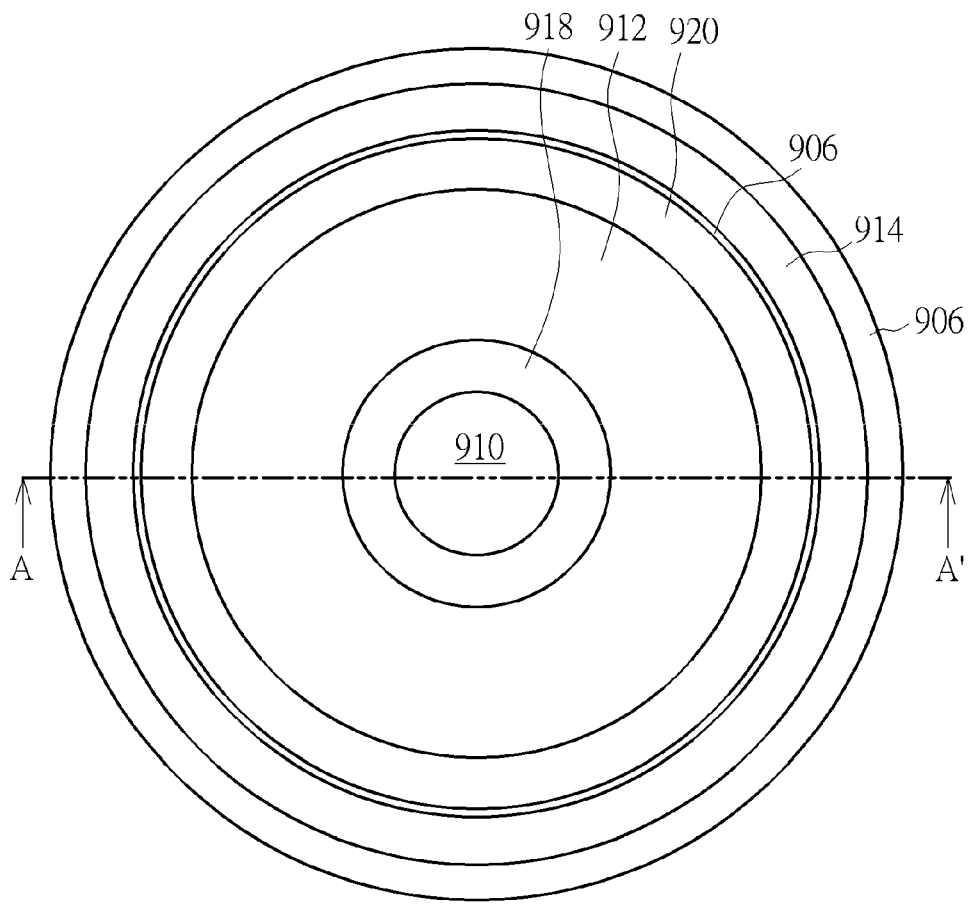
FIG. 10 is a schematic diagram illustrating a top view of an ESD protection device according to a ninth embodiment of the present invention.
Figure 11:
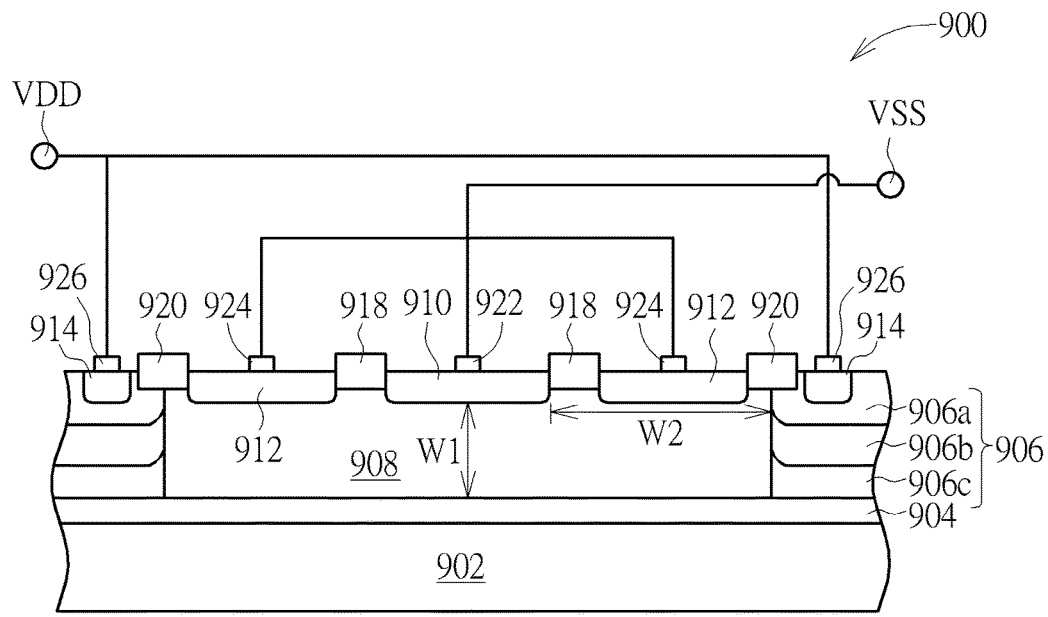
FIG. 11 is a schematic diagram illustrating a cross-sectional view taken along a cross-sectional line A-A' of FIG. 10.

The present invention further provides an ESD protection device which has the ESD protection circuit of the eighth embodiment. Please refer to FIG. 10 and FIG. 11. FIG. 10 is a schematic diagram illustrating a top view of an ESD protection device according to a ninth embodiment of the present invention. FIG. 11 is a schematic diagram illustrating a cross-sectional view taken along a cross-sectional line A-A' of FIG. 10. As shown in FIG. 10 and FIG. 11, the ESD protection device 900 of this embodiment includes a substrate 902, a buried layer 904, a first well 906, a second well 908, a first doped region 910, and a second doped region 912. The buried layer 904 which has a first conductive type is buried in the substrate 902. The first well 906 that also has the first conductive type is disposed in the substrate 902 and is in contact with the buried layer 904. The second well 908 which has a second conductive type is disposed in the substrate 902 and is in contact with the buried layer 904 and the first well 906. The first doped region 910 which has the first conductive type is disposed in the second well 908. The second doped region 912 which has the second conductive type is disposed in the second well 908, and the second doped region 912 is disposed between the first doped region 910 and the first well 906. In this embodiment, the first conductive type may be n-type, and the second conductive type may be p-type. The present invention is not limited thereto, and the first conductive type and the second conductive type may be exchanged.

Specifically, the n-type buried layer 904 is disposed under the n-type first well 906 and the p-type second well 908, and the p-type second well 908 is surrounded by the n-type first well 906. In this embodiment, the p-type second well 908 is isolated from the substrate 902 by the n-type buried layer 904 and the n-type first well 906, so that the potential of the p-type second well 908 doesn't have to be the same as the potential of the substrate 902. The p-type second well 908 of the present invention is not limited thereto, and may not be isolated by the n-type buried layer 904 and may be in contact with the substrate. Otherwise, a doping concentration of the n-type buried layer 904 may be preferably larger than a doping concentration of the n-type first well 906. In this embodiment, the ESD protection device may be a circular structure, and the n-type first well 906 and the n-type second doped region 912 may be ring-shaped. The present invention is not limited thereto, and the ESD protection device may be a square-like structure.

Please refer to FIG. 9 and FIG. 11. As we can see from the above-mentioned ESD protection device 900 that can corresponds to the ESD protection circuit 800, the n-type buried layer 904, the p-type second well 908 and the n-type first doped region 910 can form the first BJT 802 that is a vertical NPN BJT. In the first NPN BJT 802, the n-type buried layer 904 serves as the collector C1, the p-type second well 908 serves as the base B1, and the n-type first doped region 910 serves as the emitter E1. Thus, the n-type buried layer 904 and the p-type second well 908 form the first parasitic diode D1.

The n-type first well 906, the p-type second well 908 and the n-type first doped region 910 form the second BJT 804 that is a lateral NPN BJT. In the second NPN BJT 804, the n-type first well 906 serves as the collector C2, the p-type second well 908 serves as the base B2, and the n-type first doped region 910 serves as the emitter E2. Thus, the n-type first well 906 and the p-type second well 908 form the second parasitic diode D2.

Since the p-type second doped region 912 is disposed between the n-type first doped region 910 and the n-type first well 906, the width of the p-type second well 908 between the n-type first doped region 910 and the n-type first well 906 can be increased to raise the holding voltage of the ESD protection device 900. However, when the width of the p-type second well 908 between the n-type first doped region 910 and the n-type first well 906 is increased, the trigger voltage of the second NPN BJT 804 is also increased. In order to reduce the trigger voltage of the ESD protection device 900, the n-type buried layer 904 is disposed under the n-type first well 906 and the p-type second well 908 of the lateral second NPN BJT 904 to form the vertical first NPN BJT 802.

In this embodiment, the width of the p-type second well 908 between the n-type first well 906 and the n-type first doped region 910, which is the second base width W2 of the second NPN BJT 804, is greater than a width of the p-type second well 908 between the n-type first doped region 910 and the n-type buried layer 904, which is the first base width W1 of the first NPN BJT 802, so that the breakdown voltage of the first parasitic diode D1 can be lower than the breakdown voltage of the second parasitic diode D2. Hence, the trigger voltage of the first NPN BJT 802 can be lower than the trigger voltage of the second NPN BJT 804 and serve as the trigger source, thereby reducing the trigger voltage of the ESD protection device 900. When the ESD event occurs, the ESD current will enter the p-type second well 908 through the PN junction between the p-type second well 908 and the n-type buried layer 904, thereby further trigger the p-type second well 908 between the n-type first doped region 910 and the n-type first well 906. The n-type first well 906 is closer to the n-type third doped region 914 than the n-type buried layer 904, so that the resistance between the n-type first well 906 and the n-type third doped region 914 is less than the resistance between the n-type buried layer 904 and the n-type third doped region 914. Thus, the n-type first well 906, the p-type second well 908 and the n-type first doped region 910 can form an ESD discharge path to conduct the ESD current.

Furthermore, the n-type first doped region 910 disposed in the p-type second well 908 is in contact with a top surface of the substrate 902. Accordingly, the n-type first doped region 910 can be directly electrically connected to the low voltage power line VSS. The p-type second doped region 912 disposed in the p-type second well 908 is in contact with the top surface of the substrate 902, so that the p-type second doped region 912 can be used to electrically connect the p-type second well 908 to the low voltage power line VSS. The p-type second well 908 can form the first resistor 806. It depends on the distances between parts of the p-type second well 908 serving as the base B1 of the first NPN BJT 802 and the base B2 of the second NPN BJT 804 and the n-type second doped region 912.

Specifically, the base B2 of the second NPN BJT 804 is mainly formed by a part of the p-type second well 908 disposed between the n-type first doped region 910 and the n-type first well 906, so that the p-type second well 908 between the part of the p-type second well 908 and the n-type second doped region 912 form a resistor connected between the base B2 of the second NPN BTJ 804 and the low voltage power line VSS. Also, the base B1 of the first NPN BJT 802 is mainly formed by another part of the p-type second well 908 disposed right under the n-type first doped region 910, so that the p-type second well 908 between the another part of the p-type second well 908 and the n-type second doped region 912 can form another resistor connected between the base B1 of the first NPN BTJ 802 and the low voltage power line VSS. The part of the p-type second well 908 and the another part of the p-type second well 908 are not at the same position, and thus, the p-type second well 908 between them should form another resistor. These resistors should form the first resistor 806.

In addition, the ESD protection device 900 further includes an n-type third doped region 914 disposed in the n-type first well 906 and in contact with the top surface of the substrate 902, so that the n-type third doped region 914 can be used to electrically connect the n-type first well 906 and the n-type buried layer 904 to the high voltage power line VDD. Since the second NPN BJT 804 is the lateral NPN BJT, the ESD current entering the n-type third doped region 914 would pass through the n-type first well 906 between the n-type third doped region 914 and the p-type second well 908, the p-type second well 908 between the n-type first well 906 and the n-type first doped region 910, and the n-type first doped region 910 sequentially. Accordingly, the n-type first well 906 between the n-type third doped region 914 and the p-type second well 908 can form the second resistor 808. Also, since the first NPN BJT 802 is the vertical NPN BJT, the ESD current entering the n-type third doped region 914 would first pass through the n-type first well 906 in the vertical direction and between the n-type third doped region 914 and the n-type buried layer 904 and a part of the n-type buried layer 904 to the n-type buried layer 904 right under the n-type first doped region 910, and then, enter the p-type second well 908 so as to trigger the base B2 of the second NPN BJT 804. Accordingly, the n-type first well 906 between the n-type third doped region 914 and the n-type buried layer 904 and a part of the n-type buried layer 904 can form the third resistor 810. In this embodiment, a doping concentration of the n-type third doped region 914 may be larger than a doping concentration of the n-type buried layer 904.

The ESD protection device 900 may further include a first isolation layer 918 and a second isolation layer 920 for isolating the n-type first doped region 910, the p-type second doped region 912, and the n-type third doped region 914 from one another. Specifically, the first isolation layer 918 is disposed between the n-type first doped region 910 and the p-type second doped region 912, and the second isolation layer 920 is disposed between the p-type second doped region 912 and the n-type third doped region 914. The first isolation layer 918 and the second isolation 920 may respectively be a field oxide or a trench isolation structure.

In this embodiment, the n-type first well 906 may optionally include a plurality of wells, such as a deep n-type well 906c, a high voltage deep n-type well 906b for tolerating high voltage, and an n-type well 906a, stacked in sequence. The doping concentration of the wells may be adjusted according to the design requirements. The present invention is not limited thereto.

In addition, the ESD protection device 900 may further includes a first contact 922, a second contact 924 and a third contact 926, respectively in contact with the n-type first doped region 910, the p-type second doped region 912 and the n-type third doped region 914. The first contact 922 can be used to electrically connect the n-type first doped region 910 to the low voltage power line VSS. The second contact 924 can be used to electrically connect the p-type second doped region 912 to the low voltage power line VSS. The third contact 926 can be used to electrically connect the n-type third doped region 914 to the high voltage power line VDD.

It should be noted that the ESD protection device 900 of this embodiment is formed only by adding the n-type buried layer 904 and disposing the n-type buried layer 904 under the lateral second NPN BJT 804, so that the ESD protection device 900 doesn't require extra layout area to dispose the first NPN BJT 802. Accordingly, the ESD protection device 900 doesn't require increasing the layout area with the increasing holding voltage. Therefore, the ESD protection device 900 not only solves the latch-up issue but also saves the layout area.

Figure 12:
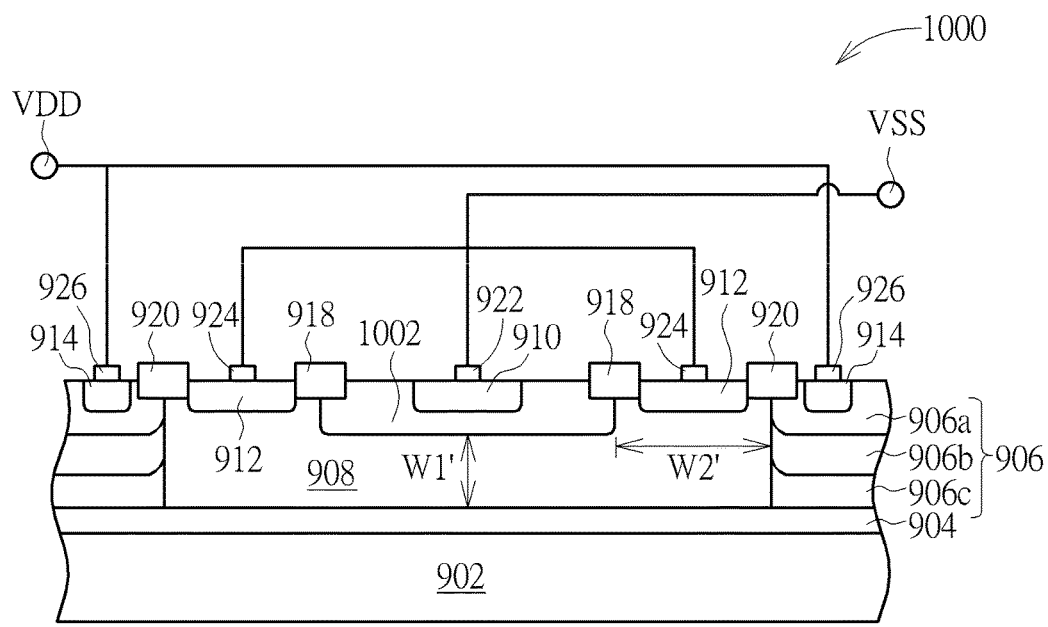
FIG. 12 is a schematic diagram illustrating a cross-sectional view of an ESD protection device according to a tenth embodiment.

Please refer to FIG. 12, which is a schematic diagram illustrating a cross-sectional view of an ESD protection device according to a tenth embodiment. As shown in FIG. 12, the tenth embodiment is different from the ninth embodiment in that the ESD protection device 1000 of this embodiment may further include an n-type graded region 1002 disposed between the n-type first doped region 910 and the p-type second well 908, and the n-type graded region 1002 surrounds the n-type first doped region 910. The disposition of the n-type graded region 1002 can reduce the width of the p-type second well 908 between the n-type region formed by the n-type first doped region 910 and the n-type graded region 1002 and the n-type buried layer 904. In other words, the first base width W1' can be reduced, so that the breakdown voltage of the first parasitic diode D1 can be reduced, thereby effectively lower the trigger voltage of the first NPN BJT 802. In this embodiment, the second base width W2' is also decreased, but the present invention is not limited thereto. In other embodiment, a diameter of the opening exposed by the first isolation layer may be the same as a diameter of the n-type first doped region, and the first isolation layer may be used as a mask to form a graded region that has a diameter the same as the diameter of the n-type first doped region. Accordingly, the graded region can be used to reduce the first base width without changing the second base width. Thus, the holding voltage of the second NPN BJT would not be changed with the reduction of the trigger voltage of the first NPN BJT.

Figure 13:
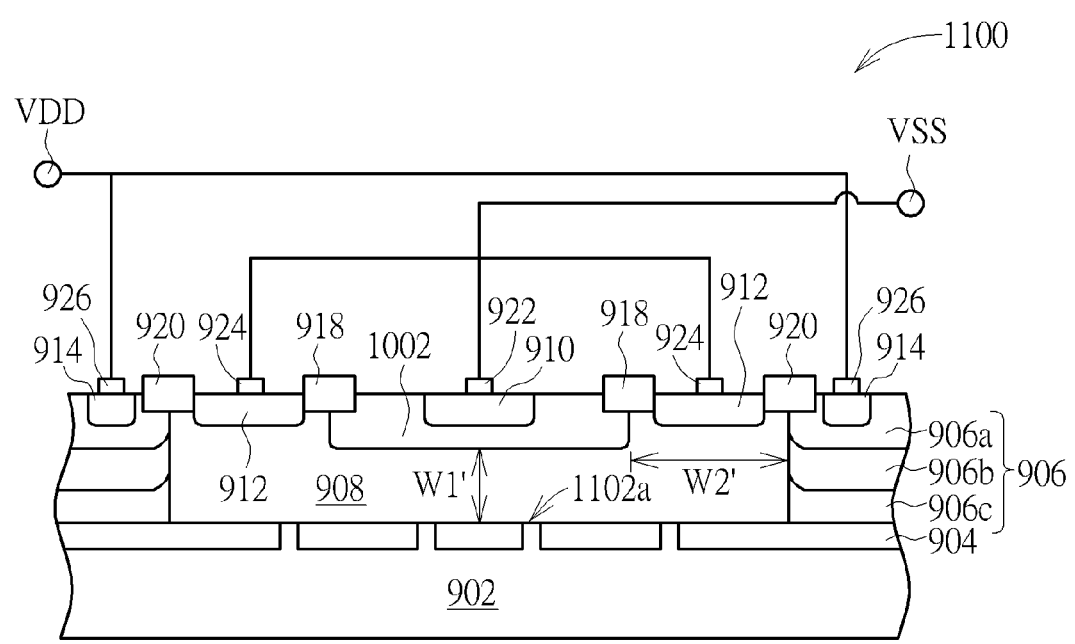
FIG. 13 is a schematic diagram illustrating a cross-sectional view of an ESD protection device according to an eleventh embodiment.

Please refer to FIG. 13, which is a schematic diagram illustrating a cross-sectional view of an ESD protection device according to an eleventh embodiment. As shown in FIG. 13, the eleventh embodiment is different from the tenth embodiment in that the n-type buried layer 1102 includes at least one through hole 1102a. Thus, the p-type second well 908 is partially in contact with the substrate 902. In this embodiment, the substrate 902 should have the same conductive type as the second well 908, such as p type.

As the above-mentioned description, the ESD protection circuit and the ESD protection device of the present invention only require adjusting the base width of the BJT to increase the holding voltage. Thus, the ESD protection device doesn't require extra layout area to dispose extra transistors. Therefore, the ESD protection device not only solves the latch-up issue but also saves the layout area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An ESD protection circuit connected between a high voltage power line and a low voltage power line, and the ESD protection circuit comprising:
    a first BJT comprising a first parasitic diode; and
    a second BJT comprising a second parasitic diode, wherein a collector of the first BJT and a collector of the second BJT are electrically connected to the high voltage power line, and an emitter and a base of the first BJT and an emitter and a base of the second BJT are electrically connected to the low voltage power line,
    wherein a breakdown voltage of the first parasitic diode is lower than a breakdown voltage of the second parasitic diode, the first BJT and the second BJT are NPN BJTs, respectively, the first BJT serves as a trigger source, and the second BJT serves to conduct ESD current from the high voltage power line.

2. The ESD protection circuit according claim 1, wherein the first BJT has a first base width, the second BJT has a second base width, and the first base width is shorter than the second base width so as to provide a holding voltage capable of reaching greater than 40 volts using the first BJT and the second BJT.

3. The ESD protection circuit according claim 1, further comprising a resistor connected between the base of the first BJT and the low voltage power line.

4. The ESD protection circuit according to claim 1, wherein the collector of the first BJT is coupled to a first resistor, which in turn is coupled to the high voltage power line, and the collector of the second BJT is coupled to a second resistor, which in turn is also coupled to the high voltage power line.

* * * * *